(12) United States Patent
Huang

(10) Patent No.: US 11,419,186 B2
(45) Date of Patent: *Aug. 16, 2022

(54) THICK FILM ELEMENT HAVING COATED SUBSTRATE WITH HIGH HEAT CONDUCTIVITY

(71) Applicant: GUANGDONG FLEXWARM ADVANCED MATERIALS & TECHNOLOGY CO., LTD., Guangzhou (CN)

(72) Inventor: Weicong Huang, Guangdong (CN)

(73) Assignee: GUANGDONG FLEXWARM ADVANCED MATERIALS & TECHNOLOGY CO., LTD., Guangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/529,086

(22) PCT Filed: Mar. 26, 2016

(86) PCT No.: PCT/CN2016/077439
§ 371 (c)(1),
(2) Date: May 24, 2017

(87) PCT Pub. No.: WO2017/133067
PCT Pub. Date: Aug. 10, 2017

(65) Prior Publication Data
US 2018/0332667 A1    Nov. 15, 2018

(30) Foreign Application Priority Data
Feb. 3, 2016   (CN) .......................... 201610075017.2

(51) Int. Cl.
*H05B 3/16*     (2006.01)
*H05B 3/12*     (2006.01)
(Continued)

(52) U.S. Cl.
CPC ................. *H05B 3/16* (2013.01); *H05B 3/06* (2013.01); *H05B 3/12* (2013.01); *H05B 3/265* (2013.01);
(Continued)

(58) Field of Classification Search
CPC ...... H05B 2203/013; H05B 3/06; H05B 3/12; H05B 3/16; H05B 3/265; H05K 1/167
(Continued)

(56) References Cited

U.S. PATENT DOCUMENTS 5,068,517 A * 11/1991 Tsuyuki ................. H05B 3/265
  219/543
5,705,793 A    1/1998 Kitaichi et al.
(Continued)

FOREIGN PATENT DOCUMENTS

CN        1320010      10/2001
CN      201936869       8/2011
(Continued)

OTHER PUBLICATIONS https://www.physicsclassroom.com/Class/thermalP/u18l1f.cfm, Henderson, Tom (Year: 1996).*

*Primary Examiner* — Dana Ross
*Assistant Examiner* — Joe E Mills, Jr.
(74) *Attorney, Agent, or Firm* — Bayramoglu Law Offices LLC

(57) ABSTRACT

The present invention provides a thick film element having a coated substrate with high heat conductivity, which comprises a carrier, a thick film coating deposited on the carrier and a covering layer overlaid on the coating. The thick film coating is a heating material, and the mode of heating is electrical heating. The carrier, the thick film coating and the covering layer are selected from a material that fulfills every of the following equations:

(Continued)

$$\lambda_3 A \frac{T_3 - T_0}{d_3} = a \times \lambda_1 A \frac{T_1 - T_0}{d_1},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

wherein $10 \leq a \leq 10^4$, $0 < b \leq 10^6$, $0 < c \leq 10^3$. The coated substrate of the thick film element of the present invention has high heat conductivity and is suitable for coating products with a heated substrate. The present invention improves heat transfer efficiency and reduces heat loss when double-sided heating is not required.

10 Claims, 1 Drawing Sheet

(51) Int. Cl.
 *H05B 3/26* (2006.01)
 *H05B 3/06* (2006.01)
 *H05K 1/16* (2006.01)
(52) U.S. Cl.
 CPC ....... *H05K 1/167* (2013.01); *H05B 2203/013* (2013.01)

(58) Field of Classification Search
 USPC .......................................................... 219/536
 See application file for complete search history.

(56) References Cited

U.S. PATENT DOCUMENTS

| | | | |
|---|---|---|---|
| 2002/0158328 A1 | 10/2002 | Hiramatsu et al. | |
| 2009/0008142 A1* | 1/2009 | Shimizu | H05K 1/0366 174/261 |
| 2009/0199994 A1* | 8/2009 | Amano | F28D 20/023 165/10 |
| 2014/0332518 A1* | 11/2014 | Lesmeister | F21V 29/90 219/202 |
| 2015/0163862 A1* | 6/2015 | Chabach | B60N 2/5685 219/481 |
| 2015/0373782 A1* | 12/2015 | Kang | H05B 3/146 219/541 |
| 2016/0249413 A1* | 8/2016 | Lim | H05B 3/12 |
| 2016/0270152 A1* | 9/2016 | Duce | F24H 9/1872 |

FOREIGN PATENT DOCUMENTS

| | | |
|---|---|---|
| CN | 103546998 | 1/2014 |
| CN | 104395143 | 3/2015 |
| CN | 104425053 | 3/2015 |
| JP | 2004022485 | 1/2004 |

* cited by examiner

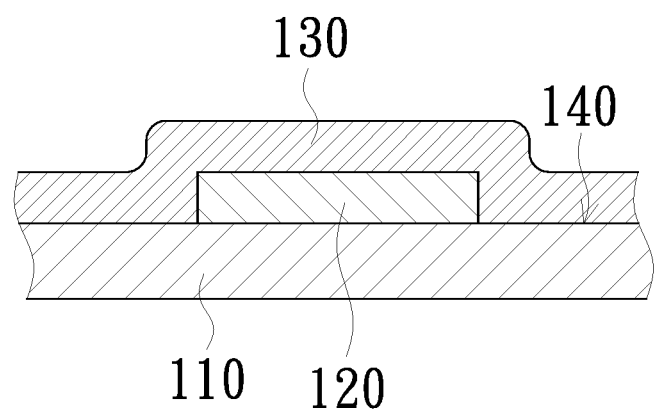

THICK FILM ELEMENT HAVING COATED SUBSTRATE WITH HIGH HEAT CONDUCTIVITY

FIELD OF THE INVENTION

The present invention relates to the field of thick film, and more particularly to a thick film element having a coated substrate with high heat conductivity.

BACKGROUND OF THE INVENTION

Thick film heating elements refer to heating elements that are made by fabricating exothermic materials on a substrate into thick films and providing electricity thereto to generate heat. The conventional heating methods include electrical heated tube heating and PTC heating. An electrical heated tube heating element uses a metal tube as the outer case and distributes nickel-chromium or iron-chromium alloy spirally therein to form heater strips; the clearance space is then filled with magnesite clinker that has excellent thermal conductivity and insulativity and sealed with silica gel from two ends of the tube. The PTC heating method uses ceramics as the exothermic material. Both electrical heated tube heating and PTC heating conduct heat indirectly with low thermal efficiency, and are structurally huge and bulky. Besides, in consideration of environmental protection, heaters using these two types of heating methods stain easily after repeatedly heating and cleaning thereof is not easy. Additionally, PTC heaters contain lead and other hazardous substances and are easily oxidized, causing power attenuation and short service life.

Chinese application CN201310403454.9 discloses a ceramic tile-based resistance slurry for thick film circuits and the preparation method thereof, which provides a resistance slurry that matches ceramic tiles and provides a possibility for preparation of a new underfloor heating elements. The raw materials of the resistance slurry include solid phase contents (including glass ceramic powder and silver powder) and organic binding agent, with the weight percentage of each of the materials being 70-85% of glass ceramic powder and 15-30% of organic binding agent; the sum of which are 100%. The resistance slurry is mainly used to be printed on the back of ceramic tiles to form a thick film circuit.

Chinese application CN201020622756.7 discloses a thick film circuit device, which comprises a ceramic substrate, a thick film circuit wafer and electric wires. The thick film circuit wafer is disposed on the ceramic substrate, and outer sides of the ceramic substrate are covered by an epoxy layer. The two electric wires are connected to both sides of the ceramic substrate, and the connection points between the electric wires and the ceramic substrate are covered by in the epoxy layer.

It could be seen from the above technologies that thick film technology is developing gradually; however, at present the researches mostly focus on developing resistance slurry for thick film circuits but rarely on the component products of thick films. The technical solution of the above-mentioned thick film circuit device realizes disposing thick film circuits within the ceramic substrate and epoxy layer, but thermal conductivity thereof is not excellent. The application of thick films in products greatly broadens the development of heating products. The existing heating device could meet the demands of heating; however, heating device that performs unilateral heat transfer is rarely seen, or unilateral heat transfer of such device is too poor, making it difficult to reduce heat loss by keeping high unilateral thermal conduction properties.

SUMMARY OF THE INVENTION

To solve the problems mentioned above, the present invention provides a thick film element having a coated substrate with high heat conductivity that has the advantages of small volume, high efficiency, environmental-friendly, high safety performance and long service lifespan.

The concept of thick film in the present invention is a term comparative to thin films. Thick film is a film layer with a thickness ranging from several microns to tens of microns formed by printing and sintering on a carrier; the material used to manufacture the film layer is known as thick film material, and the coating made from the thick film is called thick film coating. The thick film element has the advantages of high power density, fast heating speed, high working temperature, fast heat generating rate, high mechanical strength, small volume, easy installation, uniform heating temperature field, long lifespan, energy saving and environmental friendly, and excellent safety performance.

The thick film element having a coated substrate with high heat conductivity of the present invention comprises a carrier, a thick film coating deposited on the carrier and a covering layer overlaid on the coating. The thick film coating is a heating material, and the mode of heating is electrical heating. The carrier, the thick film coating and the covering layer are selected from a material that fulfills every of the following equations:

$$\lambda_3 A \frac{T_3 - T_0}{d_3} = a \times \lambda_1 A \frac{T_1 - T_0}{d_1},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

$$10 \le a \le 10^4,\ 0 < b \le 10^6,\ 0 < c \le 10^3;$$

$T_2 < T_{Minimum\ melting\ point\ of\ the\ covering\ layer}$;
$T_2 < T_{Minimum\ melting\ point\ of\ the\ carrier}$;
$T_0 \le 25°\ C.$;
wherein the value of $$\lambda_1 A \frac{T_1 - T_0}{d_1}$$

represents the heat transfer rate of the covering layer; the value of $$\lambda_2 A \frac{T_2 - T_0}{d_2}$$

represents the heat generating rate of the thick film coating; the value of $$\lambda_3 A \frac{T_3 - T_0}{d_3}$$

represents the heat transfer rate of the carrier;

$\lambda_1$ represents the heat conductivity coefficient of the covering layer at the temperature of $T_1$; $\lambda_2$ represents the heat conductivity coefficient of the thick film coating at the temperature of $T_2$;

$\lambda_3$ represents the heat conductivity coefficient of the carrier at the temperature of $T_3$;

A represents the contact area of the thick film coating with the covering layer or the carrier;

$d_1$ represents the thickness of the covering layer;

$d_2$ represents the thickness of the thick film coating;

$d_3$ represents the thickness of the carrier;

$T_0$ represents the initial temperature of the thick film element;

$T_1$ represents the surface temperature of the covering layer;

$T_2$ represents the heating temperature of the thick film coating;

$T_3$ represents the surface temperature of the carrier;

$d_2 \leq 50$ μm;

and $d_1 \geq 10$ μm; 10 μm $\leq d_3 \leq 20$ cm;

$T_{Minimum\ melting\ point\ of\ the\ carrier} > 25°$ C.;

$\lambda_3 \geq \lambda_1$;

the covering layer refers to a dielectric layer covering the thick film coating by printing and/or sintering or gluing, and the area of the covering layer is larger than that of the thick film coating.

The carrier is the dielectric layer carrying the thick film coating. The thick film coating covers the carrier by printing, coating, spraying or sintering, and is the coated substrate of the thick film element.

The heat conductivity coefficient refers to the heat transferred by a one-meter-thick material having a temperature difference between two side surfaces of 1 degree (K, ° C.) through one square meter (1 m$^2$) area within one second (1 S) under a stable heat transfer condition. Unit of the heat conductivity coefficient is watt/meter·degree (W/(m·K), and K may be replaced by ° C.).

The covering layer, the thick film coating and the carrier stick closely with each other at the electrical heating parts of the thick film elements, and both sides of the thick film coating connect to external electrodes. When given electricity, the thick film energy. Heat generating rate of the thick film coating could be calculated by $$\lambda_2 A \frac{T_2 - T_0}{d_2}$$

according to heat conductivity coefficient, contact area, initial temperature, heating temperature and thickness of the thick film coating, wherein $T_2$ represents the heating temperature of the thick film.

The present invention features in that the thick film element has a coated substrate having high heat conductivity, and that the heat generating rate of the covering layer, the thick film coating and the carrier should meet the following requirements:

(1) The heat transfer rate of the covering layer and the thick film coating should satisfy the following formula:

$$\lambda_3 A \frac{T_3 - T_0}{d_3} = a \times \lambda_1 A \frac{T_1 - T_0}{d_1},$$

wherein $10 \leq a \leq 10^4$; for those thick film elements satisfied the above equation, the heat transfer ability of their carrier is superior to that of the covering layer, which means that the carrier is fast while the covering layer is slow at temperature rising or that the temperature difference between the covering layer and the carrier is large after stable heat balance. Therefore, the thick film elements generally show the technical effect of carrier heating.

(2) The heat generating rate of the thick film coating and the heat transfer rate of the covering layer should satisfy the following formula:

$$\lambda_2 A \frac{T_2 - T_0}{d_2} = b \times \lambda_1 A \frac{T_1 - T_0}{d_1},$$

wherein $0 < b \leq 10^6$; if the heat generating rate of the thick film coating is much larger than the heat transfer rate of the covering layer, the continuously accumulated heat of the thick film coating could not be conducted away, such that the temperature of the thick film coating keeps rising, and when the temperature is higher than the minimum melting point of the covering layer, the covering layer would begin to melt or even burn, which would destroy the structure of the covering layer or the carrier, thus destroying the thick film elements.

(3) The heat generating rate of the thick film coating and the heat transfer rate of the carrier should satisfy the following formula:

$$\lambda_2 A \frac{T_2 - T_0}{d_2} = c \times \lambda_3 A \frac{T_3 - T_0}{d_3}, 0 < c \leq 10^3,$$

if the heat generating rate of the thick film coating is much larger than the heat transfer rate of the carrier, the continuously accumulated heat of the thick film coating could not be conducted away, such that the temperature of the thick film coating keeps rising, and when the temperature is higher than the minimum melting point of the carrier, the carrier would begin to melt or even burn, which would destroy the structure of the carrier, thus destroying the thick film elements.

(4) The heating temperature of the thick film coating could not be higher than the minimum melting point of the covering layer or the carrier, and should meet the requirements: $T_2 < T_{Minimum\ melting\ point\ of\ the\ covering\ layer}$ and $T_2 < T_{Minimum\ melting\ point\ of\ the\ carrier}$. Excessively high heating temperature should be avoided to prevent destruction of the thick film elements.

When the above-mentioned requirements are met, the heat transfer rate of the covering layer and the carrier is determined by properties of the material and the thick film element.

$$\lambda_3 A \frac{T_3 - T_0}{d_3},$$

The formula for calculating the heat transfer rate of the carrier is wherein $\lambda_3$ represents the heat conductivity coefficient of the carrier, with the unit being W/m·k, and is determined by properties of the materials for preparing the carrier; $d_3$ represents the thickness of the carrier, and is determined by preparation technique and requirements of the thick film elements; $T_3$ represents the surface temperature of the carrier, and is determined by properties of the thick film elements.

The formula for calculating the heat transfer rate of the covering layer is $$\lambda_1 A \frac{T_1 - T_0}{d_1},$$

wherein $\lambda_1$ represents the heat conductivity coefficient of the covering layer, with the unit being W/m·k, and is determined by properties of the material for preparing the covering layer; $d_1$ represents the thickness of the covering layer, and is determined by preparation technique and requirements of the thick film elements; $T_1$ represents the surface temperature of the covering layer, and is determined by properties of the thick film elements.

Preferably, the heat conductivity coefficient of the carrier $\lambda_3$ is ≥3 W/m·k, the heat conductivity coefficient of the covering layer $\lambda_1$ is ≤3 W/m·k; wherein $10 \le a \le 10^4$, $10^4 \le b \le 10^6$, $10 \le c \le 10^3$.

Preferably, the carrier and the thick film coating are bound by printing or sintering; the thick film coating and the covering layer are bound by printing, coating, spraying, sintering, or gluing.

Preferably, as shown in FIG. 1, the region 140 between the carrier 110 and the covering layer 130 without the thick film coating 120 is bound by printing, coating, spraying or sintering, or with gluing.

Preferably, the carrier includes polyimides, organic insulating materials, inorganic insulating materials, ceramics, glass ceramics, quartz, stone materials, fabrics and fiber.

Preferably, the thick film coating is one or more of silver, platinum, palladium, palladium oxide, gold and rare earth materials.

Preferably, the covering layer is made from one or more of polyester, polyimide or polyetherimide (PEI), ceramics, silica gel, asbestos, micarex, fabric and fiber.

Preferably, the area of the thick film coating is smaller than or equal to the area of the covering layer or the carrier.

The present invention also provides a use of the thick film element for coating products with substrate heating.

The beneficial effects of the present invention are as follows:

(1) The coated substrate of the thick film element of the present invention has a high heat conductivity, and is suitable for coating products with substrate heating to improve heat transfer efficiency and reduce heat loss when double-sided heating is not required.

(2) The three-layered structure of the thick film element of the present invention could be directly bound by printing or sintering, and the thick film coating would heat the carrier directly without the need of any medium. Hence, heat could be conducted to the carrier directly, thus improving heat conduction efficiency. Additionally, the covering layer of the present invention is overlaid on the thick film coating, avoiding electric leakage of the thick film coating after given electricity and improving safety performance.

The thick film element of the present invention generates heat by the thick film coating, the thickness range of which is at the micrometer level, and has a uniform heat generating rate and long service lifespan.

BRIEF DESCRIPTION OF THE DRAWINGS

FIG. 1 is a schematic cross-sectional view of a thick film element in accordance with the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Referring to FIG. 1, the present invention discloses a thick film element 100 having a coated substrate with high heat conductivity, which comprises a carrier 110, a thick film coating 120 deposited on the carrier 110 and a covering layer 130 overlaid on the coating 120; the thick film coating 120 is a heating material, and the mode of heating is electrical heating, wherein the carrier 110, the thick film coating 120 and the covering layer 130 are selected from a material that fulfills every of the following equations:

$$\lambda_1 A \frac{T_1 - T_0}{d_1} = a \times \lambda_3 A \frac{T_3 - T_0}{d_3},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

$$10 \le a \le 10^4, 0 < b \le 10^6, 0 < c \le 10^3;$$

$T_2 < T_{Minimum\ melting\ point\ of\ the\ covering\ layer}$;
$T_2 < T_{Minimum\ melting\ point\ of\ the\ carrier}$;
$T_0 \le 25°$ C.;
$d_2 \le 50$ μm;
and $d_1 \ge 10$ μm; 10 μm $\le d_3 \le 20$ cm;
$T_{Minimum\ melting\ point\ of\ the\ carrier} > 25°$ C.;
$\lambda_3 \ge \lambda_1$.

The following embodiments include 20 thick film elements prepared by the inventors, and the materials for preparing the covering layer, the thick film coating and the carrier of the 20 listed thick film elements all satisfy the equations above. The detailed preparing method and formula are provided as follows:

EMBODIMENTS

Silver paste with a heat conductivity coefficient of $\lambda_2$ is selected to prepare the thick film coating, polyimides with a heat conductivity coefficient of $\lambda_3$ is selected to prepare the carrier, and polyimides with a heat conductivity coefficient of $\lambda_1$ is selected to prepare the covering layer. The three layers are bound by sintering, The area of the prepared thick film coating is $A_2$, the thickness is $d_2$; the area of the covering layer is $A_1$, the thickness is $d_1$; the area of the carrier is $A_3$, the thickness is $d_3$.

Turn on an external DC power supply to charge the thick film coating. The thick film starts to heat up; when the heating is stabled, measure the surface temperature of the covering layer and the carrier, and the heating temperature of the thick film coating under a stable heating state are measured. Heat transfer rate of the covering layer and the carrier, and heat generating rate of the thick film coating are calculated according to the following formula:

$$\lambda_1 A \frac{T_1 - T_0}{d_1}, \lambda_2 A \frac{T_2 - T_0}{d_2}, \lambda_3 A \frac{T_3 - T_0}{d_3}.$$

Tables 1 to 4 are the 20 thick film elements prepared by the inventors. After provided electricity to heat for 2 minutes, the thick film elements are measured according the national standards to obtain the performance data (heat conductivity coefficient, surface temperature) as shown in the Tables. The thickness, contact area, initial temperature are measured before heating.

The methods to measure the heat conductivity coefficient of the covering layer, the thick film coating and the carrier are as follows:

(1) Switch on the power and adjust the heating voltage to a specific value, then turn on the power switch of the device with 6V power and preheat for 20 minutes;

(2) Conduct zero calibration for the light spot galvanometer;

(3) Calibrate the standard operating voltage of UJ31 potentiometer according to the room temperature, set the commutator switch of the potentiometer to a standard position and adjust the operating current of the potentiometer; As the voltage of standard batteries varies with the temperature, room temperature calibration is calculated by the following formula:

$$E_t = E_0 - [39.94(t-20) + 0.929(t-20)^2]; \text{ wherein } E_0 = 1.0186V.$$

(4) Place a heating plate and lower thermoelectric couples on the bottom part of a thin test specimen; place upper thermoelectric couples on the upper part of the thin test specimen. It should be noted that the thermoelectric couples must be placed at the central position of the test specimen, and cold sections of the thermoelectric couples must be placed in an ice bottle.

(5) Place the commutator switch of the potentiometer is at position 1, measure the initial temperatures at the upper part and the lower part of the test specimen; proceed only when the temperature difference between the upper part and the lower part is smaller than 0.004 mV (0.1° C.).

(6) Pre-add 0.08 mV to the initial thermoelectric potential of the upper thermoelectric couples, turn on the heating switch to start heating; meanwhile, watch the time with a stopwatch; when the light spot of a light spot galvanometer returns to zero position, turn off the heat source to obtain excess temperature and heating time of the upper part.

(7) Measure the thermoelectric potential of the lower thermoelectric couples after 4-5 minutes to obtain excess temperature and heating time of the lower part.

(8) Place the commutator switch of the potentiometer at position 2, turn on the heating switch to measure the heating current.

(9) End the test, turn off the power and clear up the instrument and equipment.

The temperature is measured by using a thermo-couple thermometer as follows:

(1) Connect thermo-sensing wires to the surfaces of the thick film coating, the carrier, and the covering layer of the heating elements, and the outdoor air.

(2) Provide electricity to the heating product with rated power, and measure the temperatures at all parts.

(3) Record the temperature $T_0$, $T_1$, $T_2$, $T_3$ at all parts of the product at every time interval by a connected computer.

The thickness is measured by using a micrometer and by piling and averaging the values.

The method to measure the melting point is as follows:

The detection instrument: differential scanning calorimeter, model DSC2920, manufactured by TA Instruments (USA). The instrument is qualified (Level A) as verified by Verification Regulation of Thermal Analyzer 014-1996.

(1) Ambient temperature: 20-25° C.; Relative humidity: <80%;

(2) Standard material for instrument calibration: Thermal analysis standard material—Indium; standard melting point 429.7485 K (156.60).

(3) Measuring procedure: referring to "GB/T19466.3-2004/ISO" for the detection procedure.

Repeat the measurement for three times to ensure normal operation of the instrument before sample testing: weight 1-2 ng of the sample, with an accuracy of 0.01 mg, place the sample in an aluminum sample plate. Testing conditions: heat the sample to 200° C. at a rate of 10° C./min, and repeat the measurement for ten times. Measurement model: collect the information of melting points by the computer and instrument, determine the initial extrapolated temperature of the endothermic melting peak by automatic collection of measured data and program analysis of spectra to directly obtain the measurement model. The measurement results are calculated according to the Bessel formula.

Table 1 is the performance data of the covering layers of the thick film elements in Embodiments 1 to 20. The details are as follows:

TABLE 1

| | Covering Layer | | | | | |
|---|---|---|---|---|---|---|
| | Heat Conductivity Coefficient $\lambda_1$ (W/m·k) | Thickness $d_1$ (μm) | Surface Temperature $T_1$ (° C.) | $T_{Minimum\ melting\ point\ of\ the\ covering\ layer}$ (° C.) | Initial Temperature $T_0$ (° C.) | Heat Transfer Rate/$10^6$ |
| Embodiment 1 | 2.3 | 4000 | 50 | 350 | 25 | 0.00023 |
| Embodiment 2 | 2.2 | 5000 | 45 | 350 | 25 | 0.0001584 |
| Embodiment 3 | 2.3 | 5000 | 50 | 350 | 25 | 0.000184 |
| Embodiment 4 | 4.6 | 5000 | 53 | 350 | 25 | 0.0005152 |
| Embodiment 5 | 2.2 | 6000 | 46 | 350 | 25 | 0.0001232 |
| Embodiment 6 | 2 | 6000 | 45 | 350 | 25 | 0.000106667 |
| Embodiment 7 | 1.8 | 6000 | 45 | 350 | 25 | 0.000096 |
| Embodiment 8 | 2.2 | 8000 | 48 | 350 | 25 | 0.000107525 |
| Embodiment 9 | 2.4 | 8000 | 45 | 350 | 25 | 0.000096 |
| Embodiment 10 | 1.85 | 10000 | 45 | 350 | 25 | 0.0000666 |
| Embodiment 11 | 2.1 | 10000 | 50 | 350 | 25 | 0.000084 |
| Embodiment 12 | 2.12 | 20000 | 50 | 350 | 25 | 0.000053 |

TABLE 1-continued

| | Covering Layer | | | | | |
|---|---|---|---|---|---|---|
| | Heat Conductivity Coefficient $\lambda_1$ (W/m·k) | Thickness $d_1$ (μm) | Surface Temperature $T_1$ (°C.) | $T_{Minimum\ melting\ point\ of\ the\ covering\ layer}$ (°C.) | Initial Temperature $T_0$ (°C.) | Heat Transfer Rate/$10^6$ |
| Embodiment 13 | 2.2 | 20000 | 45 | 350 | 25 | 0.0000352 |
| Embodiment 14 | 2.23 | 2000 | 45 | 350 | 25 | 0.0005798 |
| Embodiment 15 | 2.2 | 2000 | 55 | 350 | 25 | 0.000594 |
| Embodiment 16 | 2.2 | 12000 | 55 | 350 | 25 | 0.000143 |
| Embodiment 17 | 2.23 | 12000 | 45 | 350 | 25 | 5.94667E−05 |
| Embodiment 18 | 2.05 | 12000 | 45 | 350 | 25 | 6.83333E−05 |
| Embodiment 19 | 2.2 | 7000 | 50 | 350 | 25 | 0.000125714 |
| Embodiment 20 | 2.2 | 7000 | 50 | 350 | 25 | 9.42857E−05 |

Table 2 is the performance data of the thick film coatings of the thick film elements in Embodiments 1 to 20. The details are as follows:

TABLE 2

| | Thick Film Coating | | | | | |
|---|---|---|---|---|---|---|
| | Heat Conductivity Coefficient $\lambda_2$ (W/m·k) | Thickness $d_2$ (μm) | Area $A_2$ (m$^2$) | Heating Temperature $T_2$ (°C.) | Initial Temperature $T_0$ (°C.) | Heat Generating Rate/$10^6$ |
| Embodiment 1 | 380 | 50 | 0.016 | 116 | 25 | 11.0656 |
| Embodiment 2 | 320 | 50 | 0.018 | 110 | 25 | 9.792 |
| Embodiment 3 | 380 | 40 | 0.016 | 103 | 25 | 11.856 |
| Embodiment 4 | 380 | 40 | 0.02 | 112 | 25 | 16.53 |
| Embodiment 5 | 380 | 30 | 0.016 | 98 | 25 | 14.79466667 |
| Embodiment 6 | 381 | 30 | 0.016 | 97 | 25 | 14.6304 |
| Embodiment 7 | 381 | 30 | 0.016 | 95 | 25 | 14.224 |
| Embodiment 8 | 381 | 25 | 0.017 | 108 | 25 | 21.50364 |
| Embodiment 9 | 380 | 25 | 0.016 | 97 | 25 | 17.5104 |
| Embodiment 10 | 380 | 25 | 0.018 | 100 | 25 | 20.52 |
| Embodiment 11 | 380 | 30 | 0.016 | 100 | 25 | 15.2 |
| Embodiment 12 | 380 | 30 | 0.02 | 108 | 25 | 21.02666667 |
| Embodiment 13 | 381 | 20 | 0.016 | 95 | 25 | 21.336 |
| Embodiment 14 | 381 | 20 | 0.026 | 98 | 25 | 36.1569 |
| Embodiment 15 | 381 | 30 | 0.018 | 99 | 25 | 16.9164 |
| Embodiment 16 | 380.5 | 30 | 0.026 | 110 | 25 | 28.03016667 |
| Embodiment 17 | 380.5 | 35 | 0.016 | 103 | 25 | 13.56754286 |
| Embodiment 18 | 380.5 | 35 | 0.02 | 98 | 25 | 15.87228571 |
| Embodiment 19 | 380.5 | 25 | 0.016 | 94 | 25 | 16.80288 |
| Embodiment 20 | 380.5 | 25 | 0.012 | 102 | 25 | 14.06328 |

Table 3 is the performance data of the carriers of the thick film elements in Embodiments 1 to 20. The details are as follows:

TABLE 3

| | Carrier | | | | | |
|---|---|---|---|---|---|---|
| | Heat Conductivity Coefficient $\lambda_3$ (W/m·k) | Thickness $d_3$ (μm) | Surface Temperature $T_3$ (°C.) | $T_{Minimum\ melting\ point\ of\ the\ carrier}$ (°C.) | Initial Temperature $T_0$ (°C.) | Heat Transfer Rate/$10^6$ |
| Embodiment 1 | 7.15 | 20 | 105 | 350 | 25 | 0.4576 |
| Embodiment 2 | 7.15 | 80 | 100 | 350 | 25 | 0.12065625 |
| Embodiment 3 | 7.15 | 50 | 90 | 350 | 25 | 0.14872 |
| Embodiment 4 | 7.16 | 100 | 108 | 350 | 25 | 0.118856 |
| Embodiment 5 | 7.16 | 20 | 86 | 350 | 25 | 0.349408 |
| Embodiment 6 | 7.16 | 200 | 90 | 350 | 25 | 0.037232 |
| Embodiment 7 | 7.21 | 300 | 84 | 350 | 25 | 0.022687467 |
| Embodiment 8 | 7.21 | 80 | 90 | 350 | 25 | 0.099588125 |
| Embodiment 9 | 7.21 | 20 | 87 | 350 | 25 | 0.357616 |
| Embodiment 10 | 7.18 | 50 | 95 | 350 | 25 | 0.180936 |
| Embodiment 11 | 7.18 | 50 | 93 | 350 | 25 | 0.1562368 |
| Embodiment 12 | 7.18 | 50 | 105 | 350 | 25 | 0.22976 |
| Embodiment 13 | 7.15 | 30 | 85 | 350 | 25 | 0.2288 |
| Embodiment 14 | 7.15 | 30 | 88 | 350 | 25 | 0.39039 |
| Embodiment 15 | 7.15 | 25 | 85 | 350 | 25 | 0.30888 |
| Embodiment 16 | 7.17 | 25 | 100 | 350 | 25 | 0.55926 |
| Embodiment 17 | 7.17 | 50 | 94 | 350 | 25 | 0.1583136 |
| Embodiment 18 | 7.22 | 50 | 88 | 350 | 25 | 0.181944 |
| Embodiment 19 | 7.22 | 50 | 91 | 350 | 25 | 0.1524864 |
| Embodiment 20 | 7.22 | 45 | 92 | 350 | 25 | 0.128997333 |

Table 4 is the heat transfer rates calculated according to the performance data listed in Tables 1, 2 and 3. The heat transfer rates of the covering layer, the thick film coating and the carrier are calculated by ratio to obtain the limiting condition of the material of the present invention, namely the following equations:

$$\lambda_3 A \frac{T_3 - T_0}{d_3} = a \times \lambda_1 A \frac{T_1 - T_0}{d_1},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

wherein $10 \leq a \leq 10^4$, $0 < b \leq 10^6$, $0 < c \leq 10^3$.

TABLE 4

| | Covering Layer Heat Transfer Rate | Thick Film Coating Heat Generating Rate | Carrier Heat Transfer Rate | a | b | c | Satisfy the Equations? |
|---|---|---|---|---|---|---|---|
| Embodiment 1 | 230 | 11065600 | 457600 | 1989.5652 | 48111.304 | 24.181818 | Yes |
| Embodiment 2 | 158.4 | 9792000 | 120656.25 | 761.71875 | 61818.182 | 81.156177 | Yes |
| Embodiment 3 | 184 | 11856000 | 148720 | 808.26087 | 64434.783 | 79.72028 | Yes |
| Embodiment 4 | 515.2 | 16530000 | 118856 | 230.69876 | 32084.627 | 139.07586 | Yes |
| Embodiment 5 | 123.2 | 14794666.67 | 349408 | 2836.1039 | 120086.58 | 42.342095 | Yes |

TABLE 4-continued

|  | Covering Layer Heat Transfer Rate | Thick Film Coating Heat Generating Rate | Carrier Heat Transfer Rate | a | b | c | Satisfy the Equations? |
|---|---|---|---|---|---|---|---|
| Embodiment 6 | 106.6666667 | 14630400 | 37232 | 349.05 | 137160 | 392.9523 | Yes |
| Embodiment 7 | 96 | 14224000 | 22687.46667 | 236.32778 | 148166.67 | 626.95409 | Yes |
| Embodiment 8 | 107.525 | 21503640 | 99588.125 | 926.18577 | 199987.35 | 215.92574 | Yes |
| Embodiment 9 | 96 | 17510400 | 357616 | 3725.1667 | 182400 | 48.964252 | Yes |
| Embodiment 10 | 66.6 | 20520000 | 180936 | 2716.7568 | 308108.11 | 113.41027 | Yes |
| Embodiment 11 | 84 | 15200000 | 156236.8 | 1859.9619 | 180952.38 | 97.288219 | Yes |
| Embodiment 12 | 53 | 21026666.67 | 229760 | 4335.0943 | 396729.56 | 91.515785 | Yes |
| Embodiment 13 | 35.2 | 21336000 | 228800 | 6500 | 606136.36 | 93.251748 | Yes |
| Embodiment 14 | 579.8 | 36156900 | 390390 | 673.31839 | 62360.987 | 92.617383 | Yes |
| Embodiment 15 | 594 | 16916400 | 308880 | 520 | 28478.788 | 54.7669 | Yes |
| Embodiment 16 | 143 | 28030166.67 | 559260 | 3910.9091 | 196015.15 | 50.120099 | Yes |
| Embodiment 17 | 59.46666667 | 13567542.86 | 158313.6 | 2662.2242 | 228153.75 | 85.700425 | Yes |
| Embodiment 18 | 68.33333333 | 15872285.71 | 181944 | 2662.5951 | 232277.35 | 87.237203 | Yes |
| Embodiment 19 | 125.7142857 | 16802880 | 152486.4 | 1212.96 | 133659.27 | 110.19265 | Yes |
| Embodiment 20 | 94.28571429 | 14063280 | 128997.3333 | 1368.1535 | 149156 | 109.01993 | Yes |

The results listed in Table 4 show that the thick films prepared according to Embodiments 1 to 20 all satisfy the equations; and the carrier, i.e. coated substrate, has the function of generating heat and the temperature difference between the two sides are more than 40° C., so as to achieve the function of heat generation. When in use, the product could reduce heat loss when the coated substrate of the thick film element is heated, and the temperature could rise to more than 100° C. after giving electricity for two minutes, which demonstrates that the thick film element of the present invention has high heat generation efficiency.

Tables 5 to 8 are the performance data of the thick film elements in contrasting examples 1 to 10 of the present invention. All the performance data is measured as those shown in Tables 1 to 4. The details are as follows:

TABLE 5

| | Covering Layer | | | | | |
|---|---|---|---|---|---|---|
| | Heat Conductivity Coefficient $\lambda_1$ (W/m · k) | Thickness $d_1$ (μm) | Surface Temperature $T_1$ (° C.) | $T_{Minimum\ melting\ point\ of\ the\ covering\ layer}$ (° C.) | Initial Temperature $T_0$ (° C.) | Heat Transfer Rate/$10^6$ |
| Contrasting Example 1 | 7.18 | 25 | 113 | 350 | 25 | 0.4043776 |
| Contrasting Example 2 | 2.2 | 25 | 55 | 350 | 25 | 0.14784 |
| Contrasting Example 3 | 2.23 | 25 | 102 | 350 | 25 | 0.1098944 |
| Contrasting Example 4 | 7.17 | 50 | 53 | 350 | 25 | 0.2248512 |
| Contrasting Example 5 | 7.21 | 50 | 97 | 350 | 25 | 0.1661184 |
| Contrasting Example 6 | 7.18 | 75 | 51 | 350 | 25 | 0.139387733 |
| Contrasting Example 7 | 1.8 | 75 | 94 | 350 | 25 | 0.026496 |
| Contrasting Example 8 | 2.2 | 75 | 47 | 350 | 25 | 0.036138667 |
| Contrasting Example 9 | 2.4 | 100 | 93 | 350 | 25 | 0.026112 |
| Contrasting Example 10 | 7.18 | 100 | 44 | 350 | 25 | 0.0763952 |

TABLE 6

| | Thick Film Coating | | | | | |
|---|---|---|---|---|---|---|
| | Heat Conductivity Coefficient $\lambda_2$ (W/m · k) | Thickness $d_2$ (μm) | Area $A_2$ (m$^2$) | Heating Temperature $T_2$ (° C.) | Initial Temperature $T_0$ (° C.) | Heat Generating Rate/$10^6$ |
| Contrasting Example 1 | 382 | 50 | 0.016 | 116 | 25 | 11.12384 |
| Contrasting Example 2 | 382 | 50 | 0.056 | 56 | 25 | 13.26304 |

TABLE 6-continued

Thick Film Coating

|  | Heat Conductivity Coefficient $\lambda_2$ (W/m·k) | Thickness $d_2$ (μm) | Area $A_2$ (m²) | Heating Temperature $T_2$ (°C.) | Initial Temperature $T_0$ (°C.) | Heat Generating Rate/$10^6$ |
|---|---|---|---|---|---|---|
| Contrasting Example 3 | 382 | 40 | 0.016 | 103 | 25 | 11.9184 |
| Contrasting Example 4 | 382 | 40 | 0.056 | 55 | 25 | 16.044 |
| Contrasting Example 5 | 382 | 30 | 0.016 | 98 | 25 | 14.87253333 |
| Contrasting Example 6 | 382 | 30 | 0.056 | 52 | 25 | 19.2528 |
| Contrasting Example 7 | 382 | 30 | 0.016 | 95 | 25 | 14.26133333 |
| Contrasting Example 8 | 382 | 25 | 0.056 | 49 | 25 | 20.53632 |
| Contrasting Example 9 | 382 | 25 | 0.016 | 97 | 25 | 17.60256 |
| Contrasting Example 10 | 382 | 25 | 0.056 | 46 | 25 | 17.96928 |

TABLE 7

Carrier

|  | Heat Conductivity Coefficient $\lambda_3$ (W/m·k) | Thickness $d_3$ (mm) | Surface Temperature $T_3$ (°C.) | $T_{Minimum\ melting\ point\ of\ the\ carrier}$ (°C.) | Initial Temperature $T_0$ (°C.) | Heat Transfer Rate/$10^3$ |
|---|---|---|---|---|---|---|
| Contrasting Example 1 | 7.16 | 1 | 105 | 350 | 25 | 9.1648 |
| Contrasting Example 2 | 7.16 | 2 | 42 | 350 | 25 | 3.40816 |
| Contrasting Example 3 | 7.16 | 4 | 87 | 350 | 25 | 1.77568 |
| Contrasting Example 4 | 7.18 | 1 | 43 | 350 | 25 | 7.23744 |
| Contrasting Example 5 | 7.18 | 2 | 86 | 350 | 25 | 3.50384 |
| Contrasting Example 6 | 7.18 | 1 | 40 | 350 | 25 | 6.0312 |
| Contrasting Example 7 | 7.21 | 2 | 84 | 350 | 25 | 3.40312 |
| Contrasting Example 8 | 7.21 | 3 | 38 | 350 | 25 | 1.749626667 |
| Contrasting Example 9 | 7.22 | 1 | 87 | 350 | 25 | 7.16224 |
| Contrasting Example 10 | 7.22 | 2 | 40 | 350 | 25 | 3.0324 |

TABLE 8

|  | Covering Layer Heat Transfer Rate | Thick Film Coating Heat Generating Rate | Carrier Heat Transfer Rate | a | b | c | Satisfy the equations? |
|---|---|---|---|---|---|---|---|
| Contrasting Example 1 | 404377.6 | 11123840 | 9164.8 | 0.022664 | 27.508546 | 1213.757 | No |
| Contrasting Example 2 | 147840 | 13263040 | 3408.16 | 0.023053 | 89.712121 | 3891.5544 | No |
| Contrasting Example 3 | 109894.4 | 11918400 | 1775.68 | 0.0161581 | 108.45321 | 6712.0202 | No |
| Contrasting Example 4 | 224851.2 | 16044000 | 7237.44 | 0.0321877 | 71.353855 | 2216.8059 | No |

TABLE 8-continued

|  | Covering Layer Heat Transfer Rate | Thick Film Coating Heat Generating Rate | Carrier Heat Transfer Rate | a | b | c | Satisfy the equations? |
|---|---|---|---|---|---|---|---|
| Contrasting Example 5 | 166118.4 | 14872533.33 | 3503.84 | 0.0210924 | 89.529717 | 4244.6383 | No |
| Contrasting Example 6 | 139387.7333 | 19252800 | 6031.2 | 0.0432692 | 138.12406 | 3192.2006 | No |
| Contrasting Example 7 | 26496 | 14261333.33 | 3403.12 | 0.128439 | 538.24477 | 4190.6643 | No |
| Contrasting Example 8 | 36138.66667 | 20536320 | 1749.626667 | 0.0484143 | 568.26446 | 11737.544 | No |
| Contrasting Example 9 | 26112 | 17602560 | 7162.24 | 0.2742892 | 674.11765 | 2457.6892 | No |
| Contrasting Example 10 | 76395.2 | 17969280 | 3032.4 | 0.0396936 | 235.21478 | 5925.7618 | No |

Material and structure of the thick film elements in the Contrasting Examples 1 to 10 listed in the above tables neither meet the material selection requirement of the present invention, nor satisfy the equations of the present invention. After given electricity and heat generation, the temperature differences between the two sides of the thick film elements in the Contrasting Examples 1 to 10 are not significantly different, and the heating temperature difference between the covering layer and the carrier is smaller than 15° C. The thick film elements prepared according to such material selections do not meet the requirement of the thick film element having a coated substrate with high heat conductivity of the present invention or meet the product requirement of the present invention, which demonstrates the heat transfer rate and correlation of the present invention.

According to the disclosure and teaching of above-mentioned specification, those skilled in the art of the present invention can still make changes and modifications to above-mentioned embodiment, therefore, the scope of the present invention is not limited to the specific embodiments disclosed and described above, and all those modifications and changes to the present invention are within the scope of the present invention as defined in the appended claims. Besides, although some specific terminologies are used in the specification, it is merely as a clarifying example and shall not be constructed as limiting the scope of the present invention in any way.

What is claimed is:

1. A thick film element having a coated substrate with high heat conductivity, comprising:
   a carrier;
   a thick film coating deposited on the carrier; and
   a covering layer overlaid on the coating;
   wherein the thick film coating is a heating material, and the thick film coating is heated by an electrical heating;
   wherein the carrier, the thick film coating and the covering layer are selected from a material that fulfills every of following equations:

$$\lambda_3 A \frac{T_3 - T_0}{d_3} = a \times \lambda_1 A \frac{T_1 - T_0}{d_1},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

wherein $10 \leq a \leq 10^4$, $0 < b \leq 10^6$, $0 < c \leq 10^3$;
$T_2 < T_{\text{Minimum melting point of the covering layer}}$;
$T_2 < T_{\text{Minimum melting point of the carrier}}$;
$T_0 \leq 25°$ C.;
wherein a value of $$\lambda_1 A \frac{T_1 - T_0}{d_1}$$

represents a heat transfer rate of the covering layer;
a value of $$\lambda_2 A \frac{T_2 - T_0}{d_2}$$

represents a heat generating rate of the thick film coating;
a value of $$\lambda_3 A \frac{T_3 - T_0}{d_3}$$

represents a heat transfer rate of the carrier;
$\lambda_1$ represents a heat conductivity coefficient of the covering layer at a temperature of $T_1$;
$\lambda_2$ represents a heat conductivity coefficient of the thick film coating at a temperature of $T_2$;
$\lambda_3$ represents a heat conductivity coefficient of the carrier at a temperature of $T_3$;
A represents a contact area of the thick film coating with the covering layer or the carrier;
$d_1$ represents a thickness of the covering layer; $d_2$ represents a thickness of the thick film coating;
$d_3$ represents a thickness of the carrier;
$T_0$ represents an initial temperature of the thick film element; $T_1$ represents a surface temperature of the covering layer;
$T_2$ represents a heating temperature of the thick film coating;
$T_3$ represents a surface temperature of the carrier;

wherein $d_2 \leq 50$ μm; $20000$ μm$\geq d_1 \geq 2000$ μm; $20$ μm$\leq d_3 \leq 20$ cm; $T_{Minimum\ melting\ point\ of\ the\ carrier} > 25°$ C.; and $\lambda_3 \geq \lambda_1$.

2. The thick film element according to claim 1, wherein the heat conductivity coefficient $\lambda_3$ of the carrier is higher than or equal to 3 W/m·k, the heat conductivity coefficient $\lambda_1$ of the covering layer is smaller than or equal to 3 W/m·k; and $10 \leq a \leq 10^4$, $10^4 \leq b \leq 10^6$, $10 \leq c \leq 10^3$.

3. The thick film element according to claim 2, wherein an area of the covering layer is larger than an area of the thick film coating, a region between the carrier and the covering layer not having the thick film coating is bound by printing or sintering.

4. The thick film element according to claim 1, wherein the carrier and the thick film coating are bound by printing coating, spraying or sintering, and the thick film coating and the covering layer are bound by printing, sintering, or gluing.

5. The thick film element according to claim 1, wherein an area of the thick film coating is smaller than or equal to an area of the covering layer or an area of the carrier.

6. A method of using a thick film element, comprising the step of:
applying the thick film element in a coating product having a single-sided heating substrate, wherein the thick film element has a coated substrate with high heat conductivity and comprises: a carrier; a thick film coating deposited on the carrier; and a covering layer overlaid on the thick film coating, wherein the thick film coating is a heating material, and the thick film coating is heated by an electrical heating, wherein the carrier, the thick film coating and the covering layer are selected from a material that fulfills every of following equations:

$$\lambda_3 A \frac{T_3 - T_0}{d_3} = a \times \lambda_1 A \frac{T_1 - T_0}{d_1},$$

$$\lambda_2 A \frac{T_2 - T_0}{d_2} = b \times \lambda_1 A \frac{T_1 - T_0}{d_1},$$

$$\lambda_2 A \frac{T_2 - T_0}{d_2} = c \times \lambda_3 A \frac{T_3 - T_0}{d_3};$$

wherein $10 \leq a \leq 10^4$, $0 < b \leq 10^6$, $0 < c \leq 10^3$;
$T_2 < T_{Minimum\ melting\ point\ of\ the\ covering\ layer}$;
$T_2 < T_{Minimum\ melting\ point\ of\ the\ carrier}$;
$T_0 \leq 25°$ C.;
wherein a value of $$\lambda_1 A \frac{T_1 - T_0}{d_1}$$

represents a heat transfer rate of the covering layer; a value of $$\lambda_2 A \frac{T_2 - T_0}{d_2}$$

represents a heat generating rate of the thick film coating; a value of $$\lambda_3 A \frac{T_3 - T_0}{d_3}$$

represents a heat transfer rate of the carrier;
$\lambda_1$ represents a heat conductivity coefficient of the covering layer at a temperature of $T_1$;
$\lambda_2$ represents a heat conductivity coefficient of the thick film coating at a temperature of $T_2$;
$\lambda_3$ represents a heat conductivity coefficient of the carrier at a temperature of $T_3$;
A represents a contact area of the thick film coating with the covering layer or the carrier;
$d_1$ represents a thickness of the covering layer; $d_2$ represents a thickness of the thick film coating;
$d_3$ represents a thickness of the carrier;
$T_0$ represents an initial temperature of the thick film element; $T_1$ represents a surface temperature of the covering layer;
$T_2$ represents a heating temperature of the thick film coating;
$T_3$ represents a surface temperature of the carrier;
wherein $d_2 \leq 50$ μm; $20000$ μm$\geq d_1 \geq 2000$ μm; $20$ μm$\leq d_3 \leq 20$ cm; $T_{Minimum\ melting\ point\ of\ the\ carrier} > 25°$ C.; and
$\lambda_3 \geq \lambda_1$.

7. The method of using the thick film element according to claim 6, wherein the heat conductivity coefficient $\lambda_3$ of the carrier is higher than or equal to 3 W/m·k, the heat conductivity coefficient $\lambda_1$ of the covering layer is smaller than or equal to 3 W/m·k; and $10 \leq a \leq 10^4$, $10^4 \leq b \leq 10^6$, $10 \leq c \leq 10^3$.

8. The method of using the thick film element according to claim 7, wherein an area of the covering layer is larger than an area of the thick film coating, a region between the carrier and the covering layer not having the thick film coating is bound by printing or sintering.

9. The method of using the thick film element according to claim 6, wherein the carrier and the thick film coating are bound by printing coating, spraying or sintering, and the thick film coating and the covering layer are bound by printing, sintering, or gluing.

10. The method of using the thick film element according to claim 6, wherein an area of the thick film coating is smaller than or equal to an area of the covering layer or an area of the carrier.

* * * * *